(12) United States Patent
Iriguchi

(10) Patent No.: US 10,578,683 B2
(45) Date of Patent: Mar. 3, 2020

(54) MAGNETIC SENSOR CIRCUIT

(71) Applicant: ABLIC Inc., Chiba-shi, Chiba (JP)

(72) Inventor: Masao Iriguchi, Chiba (JP)

(73) Assignee: ABLIC INC., Chiba (JP)

( * ) Notice: Subject to any disclaimer, the term of this patent is extended or adjusted under 35 U.S.C. 154(b) by 57 days.

(21) Appl. No.: 15/916,898

(22) Filed: Mar. 9, 2018

(65) Prior Publication Data
US 2018/0259598 A1 Sep. 13, 2018

(30) Foreign Application Priority Data
Mar. 13, 2017 (JP) ................. 2017-047629

(51) Int. Cl.
  *G01R 33/07* (2006.01)
  *H01L 27/24* (2006.01)
  *H01L 43/04* (2006.01)
  *H01L 43/06* (2006.01)

(52) U.S. Cl.
  CPC ............ *G01R 33/077* (2013.01); *H01L 27/24* (2013.01); *H01L 43/04* (2013.01); *H01L 43/065* (2013.01)

(58) Field of Classification Search
  CPC ....... G01R 33/077; H01L 27/24; H01L 43/04; H01L 43/65
  See application file for complete search history.

(56) References Cited

U.S. PATENT DOCUMENTS

| 8,981,504 | B2 | 3/2015 | Motz et al. | |
| 9,547,048 | B2* | 1/2017 | Romero | G01R 33/077 |
| 2006/0011999 | A1* | 1/2006 | Schott | G01R 33/07 257/421 |
| 2010/0123458 | A1* | 5/2010 | Schott | G01R 33/06 324/251 |
| 2010/0252900 | A1* | 10/2010 | Minixhofer | G01R 33/07 257/421 |
| 2012/0016614 | A1* | 1/2012 | Hohe | G01R 33/0017 702/85 |
| 2013/0214775 | A1* | 8/2013 | Ausserlechner | H01L 43/065 324/251 |
| 2014/0184211 | A1* | 7/2014 | Fujita | G01R 33/0052 324/225 |
| 2014/0361766 | A1* | 12/2014 | Rohrer | G01R 33/0094 324/251 |
| 2017/0261567 | A1* | 9/2017 | Cesaretti | G01R 33/0082 |

* cited by examiner

*Primary Examiner* — Dominic E Hawkins
(74) *Attorney, Agent, or Firm* — Brinks Gilson & Lione

(57) ABSTRACT

A magnetic sensor circuit includes a first magnetic detection portion and a second magnetic detection portion. The first magnetic detection portion has: output terminals for signals corresponding to strength of a magnetic field in a first direction; a positive terminal to which a drive current of the signals is supplied; and a negative terminal from which the drive current flows out. The second magnetic detection portion has: output terminals for signals corresponding to strength of a magnetic field in a second direction; and a positive terminal to which the drive current of the signals is supplied. The positive terminal of the first magnetic detection portion, the negative terminal of the first magnetic detection portion, and the positive terminal of the second magnetic detection portion are connected in series with respect to a path of the drive current of the first signals supplied from a power supply.

8 Claims, 10 Drawing Sheets

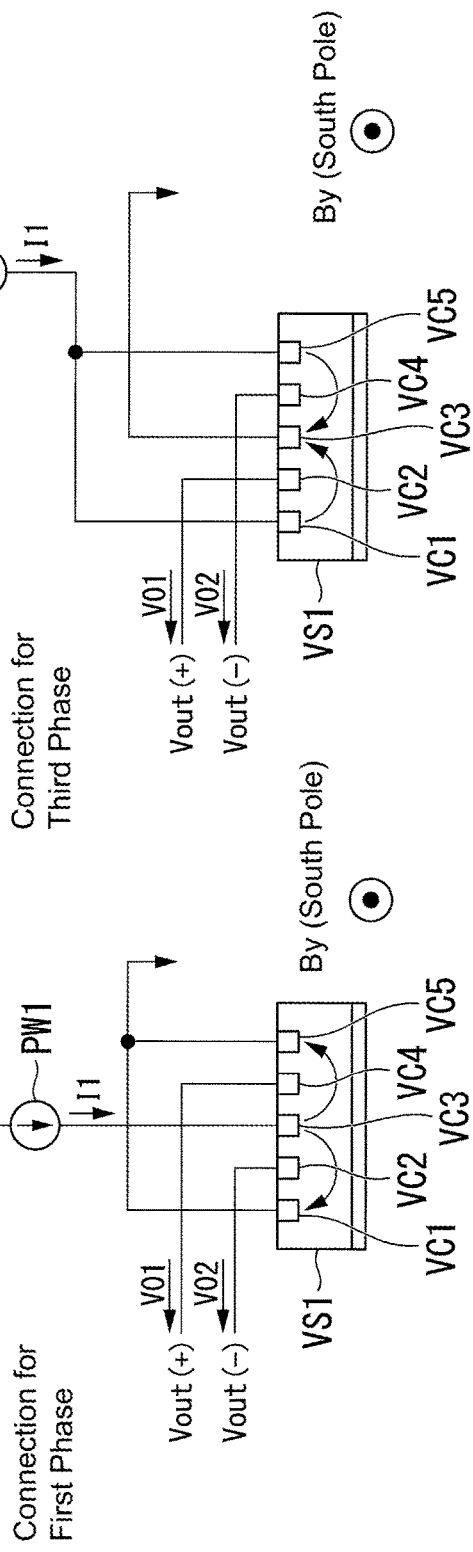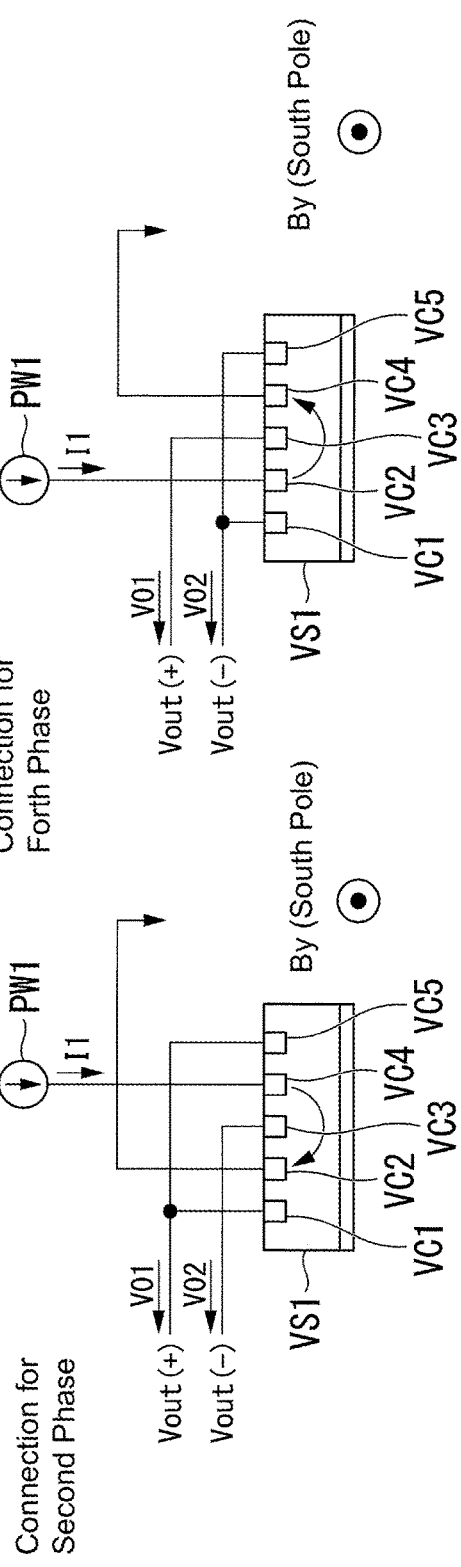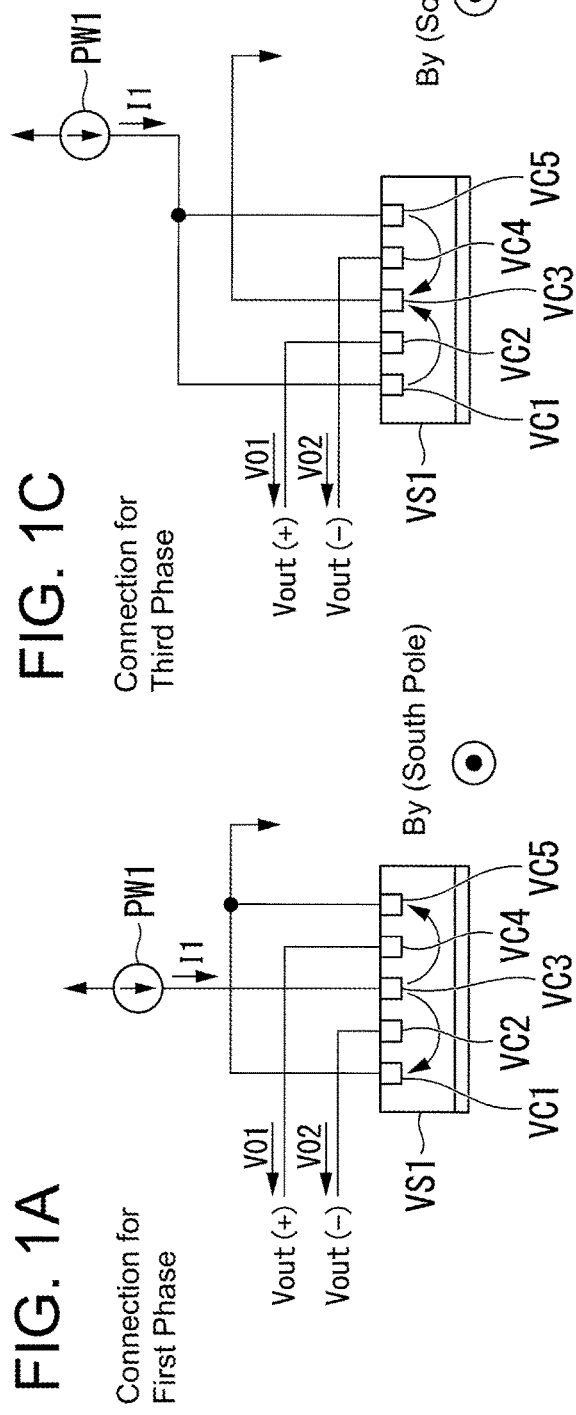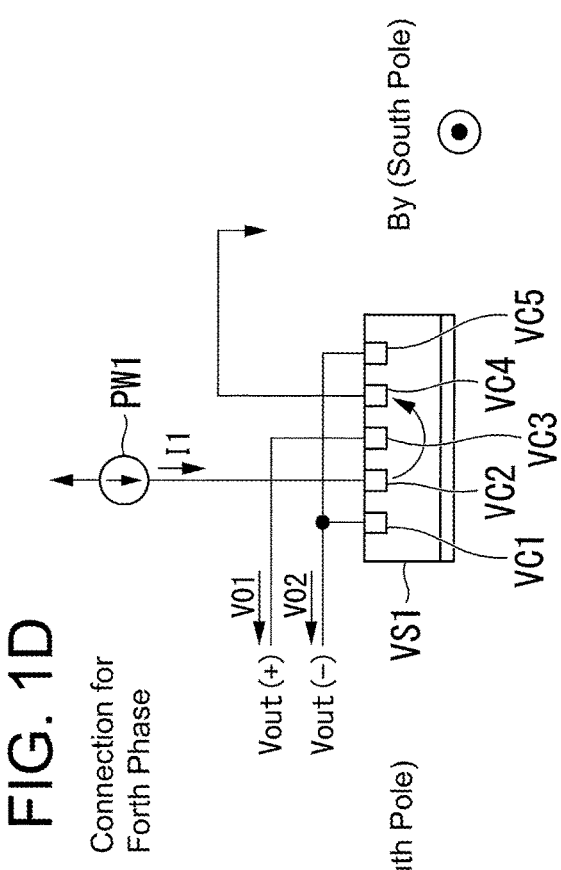
FIG. 1A Connection for First Phase
FIG. 1B Connection for Second Phase
FIG. 1C Connection for Third Phase
FIG. 1D Connection for Forth Phase

MAGNETIC SENSOR CIRCUIT

RELATED APPLICATIONS

This application claims priority under 35 U.S.C. § 119 to Japanese Patent Application No. 2017-047629 filed on Mar. 13, 2017, the entire content of which is hereby incorporated by reference.

BACKGROUND OF THE INVENTION

1. Field of the Invention

The present invention relates to a magnetic sensor circuit.

2. Description of the Related Art

Magnetic sensors using magneto-electric conversion elements, for example Hall elements, have been used as non-contact sensors in various electronic devices in recent years. The magnetic sensors are used in flip-type mobile phones, for example. The magnetic sensor detects that the mobile phone is open or closed when the magnetic field exceeds a certain threshold.

Further, some magnetic sensors integrally include a horizontal Hall element configured to detect a magnetic field component that is perpendicular to a semiconductor substrate on which the sensor is mounted, and a vertical Hall element configured to detect a magnetic field component that is parallel to the semiconductor substrate. Such sensors are applied to, for example, an integrated circuit (IC) for an encoder that detects a rotational speed and a rotational direction of a rotating body based on detection signals of a vertical magnetic field and a horizontal magnetic field, and an IC for calculating an angle of rotation based on the magnitudes of a vertical magnetic field and a horizontal magnetic field.

However, detection signals provided from Hall elements are weak. In other words, the detection signal has a voltage of from several tens of microvolts to several millivolts; hence it is difficult to ensure a signal-to-noise power ratio (S/N ratio) of a circuit.

In such a circuit having a small signal-to-noise power ratio, there have been known a configuration in which vertical Hall elements are connected in parallel and a configuration in which vertical Hall elements are connected in series and parallel for reducing an error component due to the asymmetry and structure of a device (for example, U.S. Pat. No. 8,981,504 and US Published Application No. 2013-0214775).

In each of U.S. Pat. No. 8,981,504 and US Published Patent Application No. 2013-0214775 described above, there is described a method for improving a signal-to-noise power ratio in a case in which the vertical Hall elements are used. Meanwhile, in application to the IC for an encoder and the IC for detecting an angle of rotation, it is required that a vertical Hall element and a horizontal Hall element be formed on the same IC, and an error that occurs between different axes such as a vertical magnetic field and a horizontal magnetic field be reduced.

When the horizontal Hall element and the vertical Hall element are driven with different driving sources, however, a relative error between the driving sources appears as a relative error between detection signals of a detected vertical magnetic field and a detected horizontal magnetic field. In short, this error appears as an error of an angle of rotation detected by the IC for detecting an angle of rotation.

SUMMARY OF THE INVENTION

It is an object of the present invention to provide a magnetic sensor circuit which is configured to detect magnetic fields with respect to two or more different axes, and which is capable of providing signals with a reduced error.

In order to solve the problem in the related art, a magnetic sensor circuit according to one embodiment of the present invention has the following configuration.

Specifically, the magnetic sensor circuit includes a first magnetic detection portion and a second magnetic detection portion. The first magnetic detection portion includes: at least two output terminals for outputting signals that are in phases opposite to each other and each correspond to a strength of a magnetic field in a first direction; a positive terminal to which a drive current of the signals is supplied; and a negative terminal from which the drive current flows out. The second magnetic detection portion includes: at least two terminals for outputting signals that are in phases opposite to each other and each correspond to a strength of a magnetic field in a second direction that is a direction different from the first direction; and a positive terminal to which a drive current of the signals is supplied. The positive terminal of the first magnetic detection portion, the negative terminal of the first magnetic detection portion, and the positive terminal of the second magnetic detection portion are connected in series with respect to a path of the drive current of the signals, which is supplied from a power supply.

According to the present invention, it is possible to provide a magnetic sensor circuit which is configured to detect magnetic fields with respect to two or more different axes, and which is capable of outputting signals with a reduced error.

BRIEF DESCRIPTION OF THE DRAWINGS

FIG. 1A, FIG. 1B, FIG. 1C, and FIG. 1D are diagrams for illustrating examples of a method of driving a vertical Hall element.

DETAILED DESCRIPTION OF THE EMBODIMENTS

Figure 2:
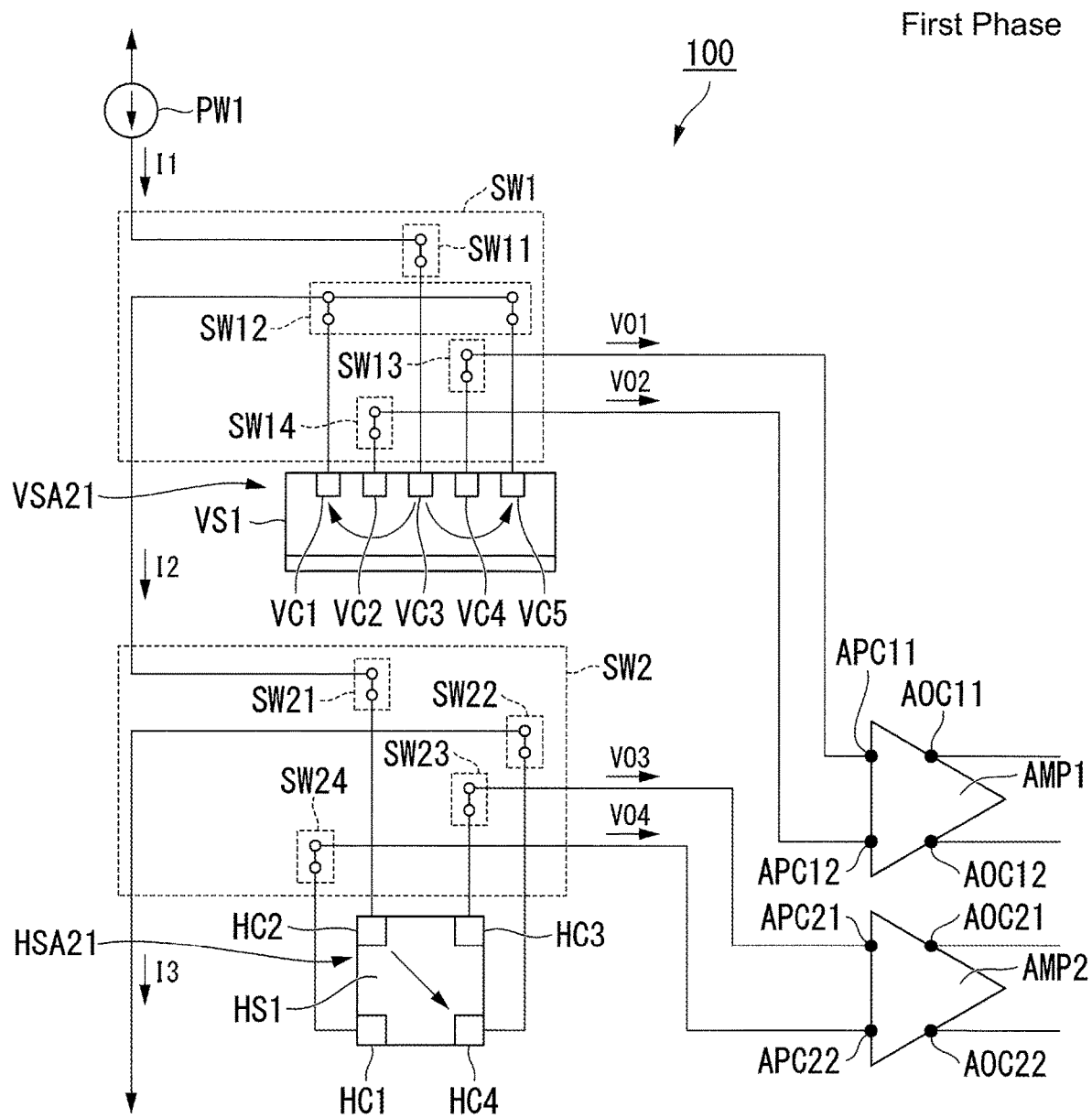
FIG. 2 is a circuit diagram of a magnetic sensor circuit according to a first embodiment of the present invention in a first phase.

Now, embodiments of the present invention are described with reference to the drawings.

[With Regard to Spinning]

With reference to FIG. 1A to FIG. 1D, the above-mentioned vertical Hall element configured to detect the magnetic field component that is parallel to the semiconductor substrate is described. FIG. 1A to FIG. 1D are diagrams for illustrating examples of a method of driving a vertical Hall element VS1. The vertical Hall element VS1 has a terminal VC1, a terminal VC2, a terminal VC3, a terminal VC4, and a terminal VC5. In the following description, the terminal VC1 to the terminal VC5 are also simply referred to as "the terminal VC" when the terminals are not distinguished from one another.

A positive power supply terminal function, a negative power supply terminal function, a positive-phase signal output function for outputting a signal in a positive phase, and a negative-phase signal output function for outputting a signal in a negative phase are ascribed to the terminal VC of the vertical Hall element. Changing the functions allocated to the terminals included in the vertical Hall element, to thereby change the direction of current in the Hall element with respect to signal output terminals of the vertical Hall element, is also referred to as "spinning". Further, a certain connection state is also referred to as "phase".

FIG. 1A is a diagram for illustrating the state of a signal which is an input to the vertical Hall element VS1 in a first phase. In the vertical Hall element VS1 in the first phase, a current I1 is supplied to the terminal VC3 from a driving source PW1 which is a constant current source. The driving source PW1 is an example of a power supply. The current I1 is an example of a drive current. In the following description, a terminal to which a drive current is supplied is also referred to as "positive power supply terminal". Being driven with the current I1, the vertical Hall element VS1 outputs signals that are in phases opposite to each other and each correspond to the strength of a horizontal magnetic field in a direction parallel to the plane of a semiconductor substrate. A signal VO1 that is an output from the terminal VC4 and a signal VO2 that is an output from the terminal VC2 are signals that are in phases opposite to each other and each correspond to the strength of a magnetic field in a first direction. In the following description, a terminal from which a current flows out is also referred to as "negative power supply terminal". The negative power supply terminal may be connected to positive power supply terminals of other Hall elements. The current I1 supplied to the terminal VC3 flows out from the terminal VC1 and the terminal VC5.

FIG. 1B is a diagram for illustrating the state of a signal that is an input to the vertical Hall element VS1 in a second phase. In the vertical Hall element VS1 in the second phase, the current I1 is supplied to the terminal VC4 from the driving source PW1. In the vertical Hall element VS1 in the second phase, the signal VO1 is an output from the terminal VC1 and the terminal VC5. In the vertical Hall element VS1 in the second phase, the signal VO2 is an output from the terminal VC3. In the vertical Hall element VS1 in the second phase, the terminal VC2 is a negative power supply terminal. The current I1 supplied to the terminal VC4 flows out from the terminal VC2.

FIG. 1C is a diagram for illustrating the state of a signal that is an input to the vertical Hall element VS1 in a third phase. In the vertical Hall element VS1 in the third phase, the current I1 is supplied to the terminal VC1 and the terminal VC5 from the driving source PW1. In the vertical Hall element VS1 in the third phase, the signal VO1 is an output from the terminal VC2. In the vertical Hall element VS1 in the third phase, the signal VO2 is an output from the terminal VC4. In the vertical Hall element VS1 in the third phase, the terminal VC3 is a negative power supply terminal. The current I1 supplied to the terminal VC1 and the terminal VC5 flows out from the terminal VC3.

FIG. 1D is a diagram for illustrating the state of a signal that is an input to the vertical Hall element VS1 in a fourth phase. In the vertical Hall element VS1 in the fourth phase, the current I1 is supplied to the terminal VC2 from the driving source PW1. In the vertical Hall element VS1 in the fourth phase, the signal VO1 is an output from the terminal VC3. In the vertical Hall element VS1 in the fourth phase, the signal VO1 is an output from the terminal VC3. In the vertical Hall element VS1 in the fourth phase, the signal VO2 is an output from the terminal VC1 and the terminal VC5. In the vertical Hall element VS1 in the fourth phase, the terminal VC4 is a negative power supply terminal. The current I1 supplied to the terminal VC2 flows out from the terminal VC4.

As described above, after being driven in a plurality of phases, the signal obtained in each phase is averaged so that the vertical Hall element can reduce an error inherent in the vertical Hall element itself, which occurs when the vertical Hall element is manufactured. In the following description, the error is also referred to as "offset". In a similar manner, the above-mentioned horizontal Hall element configured to detect the magnetic field component that is perpendicular to the semiconductor substrate also can reduce an error inherent in the horizontal Hall element itself through spinning.

First Embodiment

Next, a magnetic sensor circuit according to a first embodiment of the present invention is described with reference to FIG. 2 to FIG. 5.

FIG. 2 is a circuit diagram of a magnetic sensor circuit 100 according to the first embodiment in a first phase.

Figure 3:
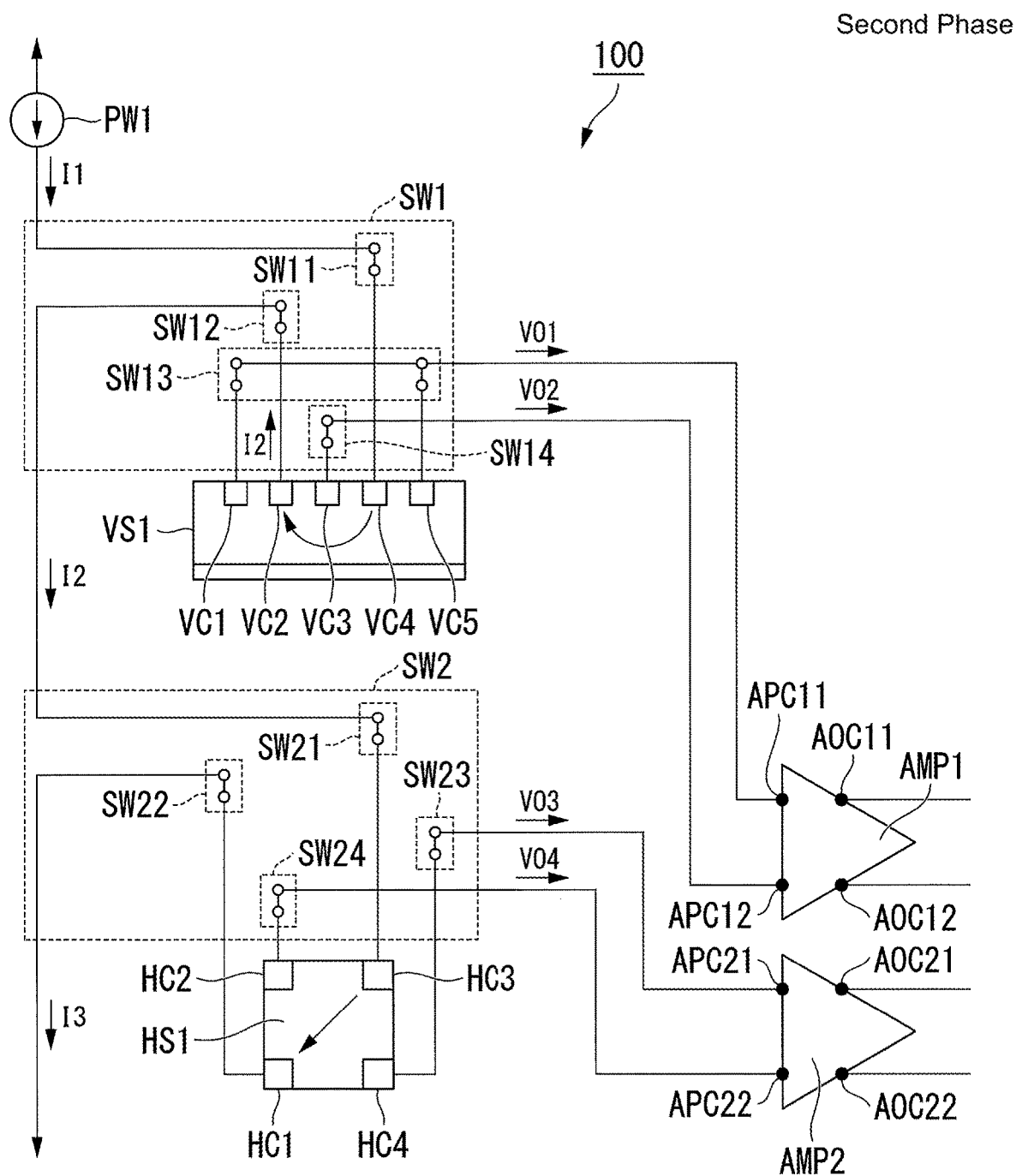
FIG. 3 is a circuit diagram of the magnetic sensor circuit according to the first embodiment in a second phase.

FIG. 3 is a circuit diagram of the magnetic sensor circuit 100 according to the first embodiment in a second phase.

Figure 4:
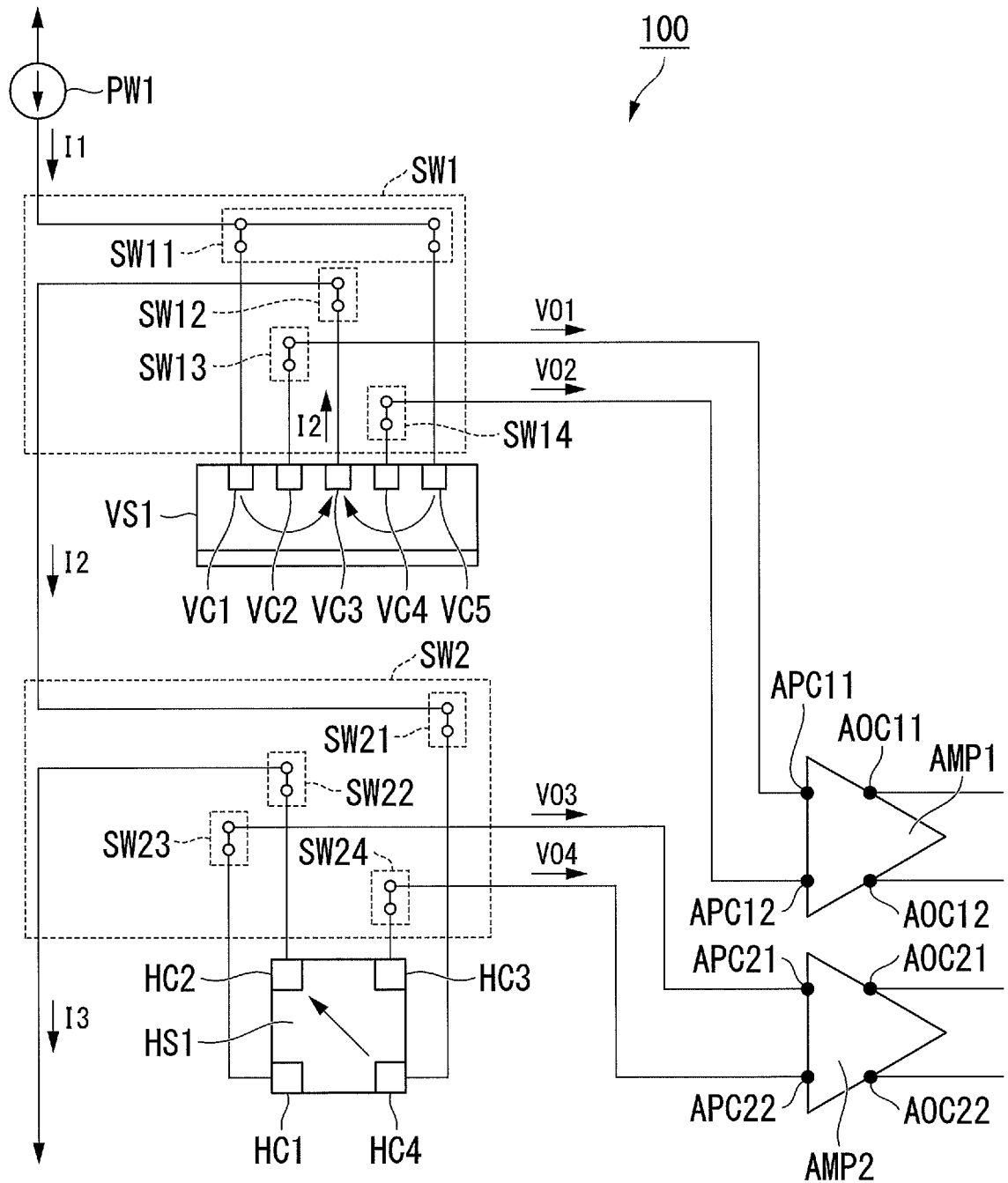
FIG. 4 is a circuit diagram of the magnetic sensor circuit according to the first embodiment in a third phase.

FIG. 4 is a circuit diagram of the magnetic sensor circuit 100 according to the first embodiment in a third phase.

Figure 5:
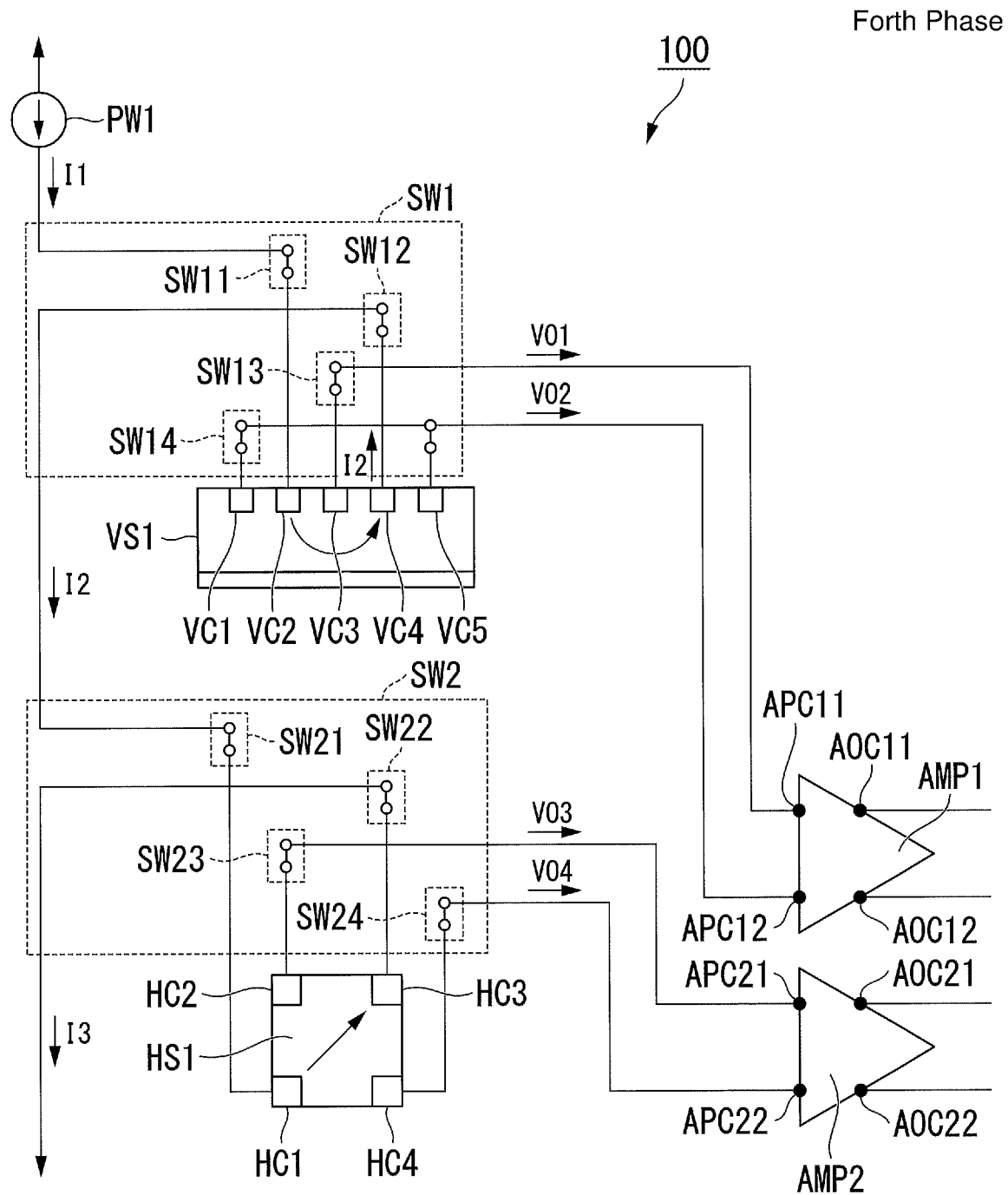
FIG. 5 is a circuit diagram of the magnetic sensor circuit according to the first embodiment in a fourth phase.

FIG. 5 is a circuit diagram of the magnetic sensor circuit 100 according to the first embodiment in a fourth phase.

The magnetic sensor circuit 100 according to the first embodiment includes the driving source PW1, a first magnetic detection portion VSA21, a second magnetic detection portion HSA21, a first switch circuit SW1, a second switch circuit SW2, an amplifier circuit AMP1, and an amplifier circuit AMP2.

The first magnetic detection portion VSA21 includes the vertical Hall element VS1 which is a magneto-electric conversion element. The vertical Hall element VS1 is an example of a first sensor.

The second magnetic detection portion HSA21 includes a horizontal Hall element HS1 which is a magneto-electric conversion element. The horizontal Hall element HS1 is an example of a second sensor.

The first switch circuit SW1 includes a first switch SW11, a first switch SW12, a first switch SW13, and a first switch SW14.

The second switch circuit SW2 includes a second switch SW21, a second switch SW22, a second switch SW23, and a second switch SW24.

The amplifier circuit AMP1 has an input terminal APC11, an input terminal APC12, an output terminal AOC11, and an output terminal AOC12.

The amplifier circuit AMP2 has an input terminal APC21, an input terminal APC22, an output terminal AOC21, and an output terminal AOC22.

The vertical Hall element VS1 and the horizontal Hall element HS1 are arranged close to each other. When the two Hall elements are arranged in this way, magnetic fields having the same strength or magnetic flux density can be applied to the two Hall elements. As a result, signals having the same voltage magnitude can be output from the two Hall elements.

[Common Matters]

The first switch SW11 is connected to the driving source PW1 and the vertical Hall element VS1. The first switch SW11 selects the supply destination of the current I1, which is supplied from the driving source PW1, among the terminal VC1 to the terminal VC5 included in the vertical Hall element VS1.

The first switch SW12 is connected to the negative power supply terminals of the above-mentioned vertical Hall element VS1 and the second switch SW21. The first switch SW12 selects the supply source of the current, which is supplied from the negative power supply terminal of the above-mentioned vertical Hall element VS1, among the terminal VC1 to the terminal VC5 included in the vertical Hall element VS1. The first switch SW12 supplies the current with which the vertical Hall element VS1 has been driven to the second switch SW21 as a current I2.

The first switch SW13 is connected to one signal output terminal of the vertical Hall element VS1 and the input terminal APC11 of the amplifier circuit AMP1. The first switch SW13 selects the supply source of the signal VO1, which is an output from the above-mentioned vertical Hall element VS1, among the terminal VC1 to the terminal VC5 included in the vertical Hall element VS1. The first switch SW13 supplies the signal VO1 which is an output from the vertical Hall element VS1, to the input terminal APC11.

The first switch SW14 is connected to another signal output terminal of the vertical Hall element VS1 and the input terminal APC12 of the amplifier circuit AMP1. The first switch SW14 selects the supply source of the signal VO2, which is an output from the above-mentioned vertical Hall element VS1, among the terminal VC1 to the terminal VC5 included in the vertical Hall element VS1. The first switch SW14 supplies the signal VO2 which is an output from the vertical Hall element VS1, to the input terminal APC12.

The second switch SW21 is connected to the first switch SW12 and a positive power supply terminal of the horizontal Hall element HS1. The second switch SW21 selects the supply destination of the current I2, which is supplied from the first switch SW12, among a terminal HC1 to a terminal HC4 included in the horizontal Hall element HS1.

The second switch SW22 is connected to a negative power supply terminal of the horizontal Hall element HS1 and a negative power supply terminal of the magnetic sensor circuit 100. The second switch SW22 selects the supply source of the current that is supplied from the negative power supply terminal of the horizontal Hall element HS1, among the terminal HC1 to the terminal HC4 included in the horizontal Hall element HS1. The second switch SW22 supplies the current I2 with which the horizontal Hall element HS1 has been driven to the negative power supply terminal of the magnetic sensor circuit 100 as a current I3.

The second switch SW23 is connected to one signal output terminal of the horizontal Hall element HS1 and the input terminal APC21 of the amplifier circuit AMP2. The second switch SW23 selects the supply source of a signal VO3 which is an output from the horizontal Hall element HS1, among the terminal HC1 to the terminal HC4 included in the horizontal Hall element HS1. The second switch SW23 supplies the signal VO3 which is an output from the horizontal Hall element HS1, to the input terminal APC21.

The second switch SW24 is connected to another signal output terminal of the horizontal Hall element HS1 and the input terminal APC22 of the amplifier circuit AMP2. The second switch SW24 selects the supply source of a signal VO4 which is an output from the horizontal Hall element HS1, among the terminal HC1 to the terminal HC4 included in the horizontal Hall element HS1. The second switch SW24 supplies the signal VO4 which is an output from the horizontal Hall element HS1, to the input terminal APC22.

The amplifier circuit AMP1 amplifies the signal VO1 and the signal VO2, which are supplied to the input terminal APC11 and the input terminal APC12, respectively. The amplifier circuit AMP1 outputs the amplified signals from the output terminal AOC11 and the output terminal AOC12.

The amplifier circuit AMP2 amplifies the signal VO3 and the signal VO4, which are supplied to the input terminal APC21 and the input terminal APC22, respectively. The amplifier circuit AMP2 outputs the amplified signals from the output terminal AOC21 and the output terminal AOC22. In the following description, the amplifier circuit AMP1 and the amplifier circuit AMP2 are also simply referred to as "the amplifier circuit" when the amplifier circuits are not distinguished from each other. A signal that is an output from the amplifier circuit may be a voltage signal or a current signal. That is, the amplifier circuit may amplify a differential input voltage input thereto, to thereby output a voltage signal. Further, the amplifier circuit may perform voltage-current conversion, to thereby output a current signal.

[Circuit in First Phase of First Embodiment]

With reference to FIG. 2, which is referred to above, the circuit in the first phase of the first embodiment is described.

The first switch SW11 in the first phase supplies the current I1 to the terminal VC3 of the vertical Hall element VS1.

The first switch SW12 in the first phase supplies, from the terminal VC1 and the terminal VC5 of the vertical Hall element VS1, the current with which the vertical Hall element VS1 has been driven to the second switch SW21 as the current I2. The current amount of the current I1 and the current amount of the current I2 are the same.

The first switch SW13 in the first phase supplies the signal VO1 which is an output from the terminal VC4 of the vertical Hall element VS1, to the input terminal APC11.

The first switch SW14 in the first phase supplies the signal VO2 which is an output from the terminal VC2 of the vertical Hall element VS1, to the input terminal APC12.

The second switch SW21 in the first phase supplies the current I2, which is supplied from the first switch SW12, to the terminal HC2 of the horizontal Hall element HS1.

The second switch SW22 in the first phase supplies the current that is supplied from the terminal HC4 of the horizontal Hall element HS1 to the negative power supply terminal of the magnetic sensor circuit 100 as the current I3. The current amount of the current I3 is the same as the current amount of each of the current I1 and the current I2 described above.

The second switch SW23 in the first phase supplies the signal VO3 which is an output from the terminal HC3 of the horizontal Hall element HS1, to the input terminal APC21.

The second switch SW24 in the first phase supplies the signal VO4 which is an output from the terminal HC1 of the horizontal Hall element HS1, to the input terminal APC22.

[Circuit in Second Phase of First Embodiment]

With reference to FIG. 3, which is referred to above, the circuit in the second phase of the first embodiment is described.

The first switch SW11 in the second phase supplies the current I1 to the terminal VC4 of the vertical Hall element VS1.

The first switch SW12 in the second phase supplies, from the terminal VC2 of the vertical Hall element VS1, the current with which the vertical Hall element VS1 has been driven to the second switch SW21 as the current I2.

The first switch SW13 in the second phase supplies the signal VO1 which is an output from the terminal VC1 and the terminal VC5 of the vertical Hall element VS1, to the input terminal APC11.

The first switch SW14 in the second phase supplies the signal VO2 which is an output from the terminal VC3 of the vertical Hall element VS1, to the input terminal APC12.

The second switch SW21 in the second phase supplies the current I2, which is supplied from the first switch SW12, to the terminal HC3 of the horizontal Hall element HS1.

The second switch SW22 in the second phase supplies, from the terminal HC1 of the horizontal Hall element HS1, the current with which the horizontal Hall element HS1 has been driven to the negative power supply terminal of the magnetic sensor circuit 100 as the current I3.

The second switch SW23 in the second phase supplies the signal VO3 which is an output from the terminal HC4 of the horizontal Hall element HS1, to the input terminal APC21.

The second switch SW24 in the second phase supplies the signal VO4 which is an output from the terminal HC2 of the horizontal Hall element HS1, to the input terminal APC22.

[Circuit in Third Phase of First Embodiment]

With reference to FIG. 4, which is referred to above, the circuit in the third phase of the first embodiment is described.

The first switch SW11 in the third phase supplies the current I1 to the terminal VC1 and the terminal VC5 of the vertical Hall element VS1.

The first switch SW12 in the third phase supplies the current that is supplied from the terminal VC3 of the vertical Hall element VS1 to the second switch SW21 as the current I2.

The first switch SW13 in the third phase supplies the signal VO1 which is an output from the terminal VC2 of the vertical Hall element VS1, to the input terminal APC11.

The first switch SW14 in the third phase supplies the signal VO2 which is an output from the terminal VC4 of the vertical Hall element VS1, to the input terminal APC12.

The second switch SW21 in the third phase supplies the current I2, which is supplied from the first switch SW12, to the terminal HC4 of the horizontal Hall element HS1.

The second switch SW22 in the third phase supplies, from the terminal HC2 of the horizontal Hall element HS1, the current with which the horizontal Hall element HS1 has been driven to the negative power supply terminal of the magnetic sensor circuit 100 as the current I3.

The second switch SW23 in the third phase supplies the signal VO3 which is an output from the terminal HC1 of the horizontal Hall element HS1, to the input terminal APC21.

The second switch SW24 in the third phase supplies the signal VO4 which is an output from the terminal HC3 of the horizontal Hall element HS1, to the input terminal APC22.

[Circuit in Fourth Phase of First Embodiment]

With reference to FIG. 5, which is referred to above, the circuit in the fourth phase of the first embodiment is described.

The first switch SW11 in the fourth phase supplies the current I1 to the terminal VC2 of the vertical Hall element VS1.

The first switch SW12 in the fourth phase supplies, from the terminal VC4 of the vertical Hall element VS1, the current with which the vertical Hall element VS1 has been driven to the second switch SW21 as the current I2.

The first switch SW13 in the fourth phase supplies the signal VO1 which is an output from the terminal VC3 of the vertical Hall element VS1, to the input terminal APC11.

The first switch SW14 in the fourth phase supplies the signal VO2 which is an output from the terminal VC1 and the terminal VC5 of the vertical Hall element VS1, to the input terminal APC12.

The second switch SW21 in the fourth phase supplies the current I2, which is supplied from the first switch SW12, to the terminal HC1 of the horizontal Hall element HS1.

The second switch SW22 in the fourth phase supplies, from the terminal HC3 of the horizontal Hall element HS1, the current with which the horizontal Hall element HS1 has been driven to the negative power supply terminal of the magnetic sensor circuit 100 as the current I3.

The second switch SW23 in the fourth phase supplies the signal VO3 which is an output from the terminal HC2 of the horizontal Hall element HS1, to the input terminal APC21.

The second switch SW24 in the fourth phase supplies the signal VO4 which is an output from the terminal HC4 of the horizontal Hall element HS1, to the input terminal APC22.

Summary of First Embodiment

As described above, the magnetic sensor circuit 100 includes the first magnetic detection portion and the second magnetic detection portion. The first magnetic detection portion has the at least two output terminals for outputting signals that are in phases opposite to each other and each correspond to the strength of the magnetic field in the first direction, the positive power supply terminal to which the drive current of the signals is supplied, and the negative power supply terminal from which the drive current flows out. The second magnetic detection portion has the at least two terminals for outputting signals that are in phases opposite to each other and each correspond to the strength of the magnetic field in the second direction, which is a direction different from the first direction, the positive power supply terminal to which the drive current of the signals is supplied, and the negative power supply terminal from which the drive current flows out. The positive power supply terminal and the negative power supply terminal, from which the drive current flows out, of the first magnetic detection portion, and the positive power supply terminal of the second magnetic detection portion are connected in series with respect to the path of the drive current of the signals, which is supplied from the power supply.

With this configuration, the magnetic sensor circuit 100 can supply currents from the same power supply to the first magnetic detection portion and the second magnetic detection portion as the drive currents. As a result, the magnetic sensor circuit 100 can reduce an error in voltage of signals that are output from the first magnetic detection portion and the second magnetic detection portion, compared to a case in which the first magnetic detection portion and the second magnetic detection portion are supplied with drive currents from different power supplies. That is, the magnetic sensor circuit 100 is capable of providing signals with a reduced error in detection of magnetic fields with respect to two or more different axes.

Further, in the description given above, the first magnetic detection portion includes the first switch circuit SW1. The second magnetic detection portion includes the second switch circuit SW2. The first switch circuit SW1 causes spinning in the vertical Hall element VS1. The second switch circuit SW2 causes spinning in the horizontal Hall element HS1. With this configuration, it is possible to reduce an error in signals that are output from the vertical Hall element VS1 and the horizontal Hall element HS1. The first switch circuit SW1 and the second switch circuit SW2 are not necessarily required.

Second Embodiment

Next, a magnetic sensor circuit according to a second embodiment of the present invention is described with reference to FIG. 6 to FIG. 9. The configuration and operation of the second embodiment that are the same as those of the first embodiment are denoted by the same reference symbols, and descriptions thereof are omitted.

Figure 6:
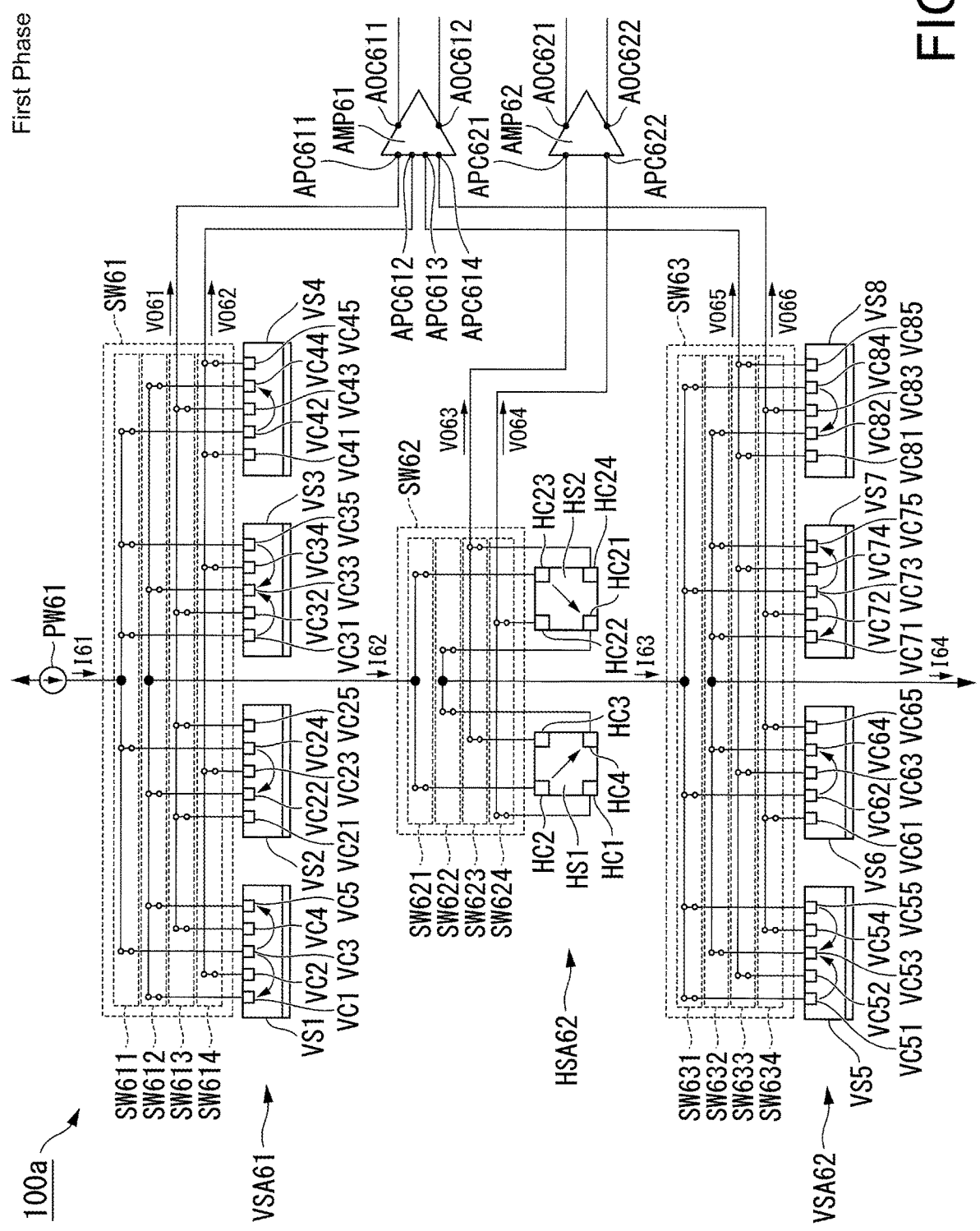
FIG. 6 is a circuit diagram of a magnetic sensor circuit according to a second embodiment of the present invention in a first phase.

FIG. 6 is a circuit diagram of a magnetic sensor circuit 100a according to the second embodiment in a first phase.

Figure 7:
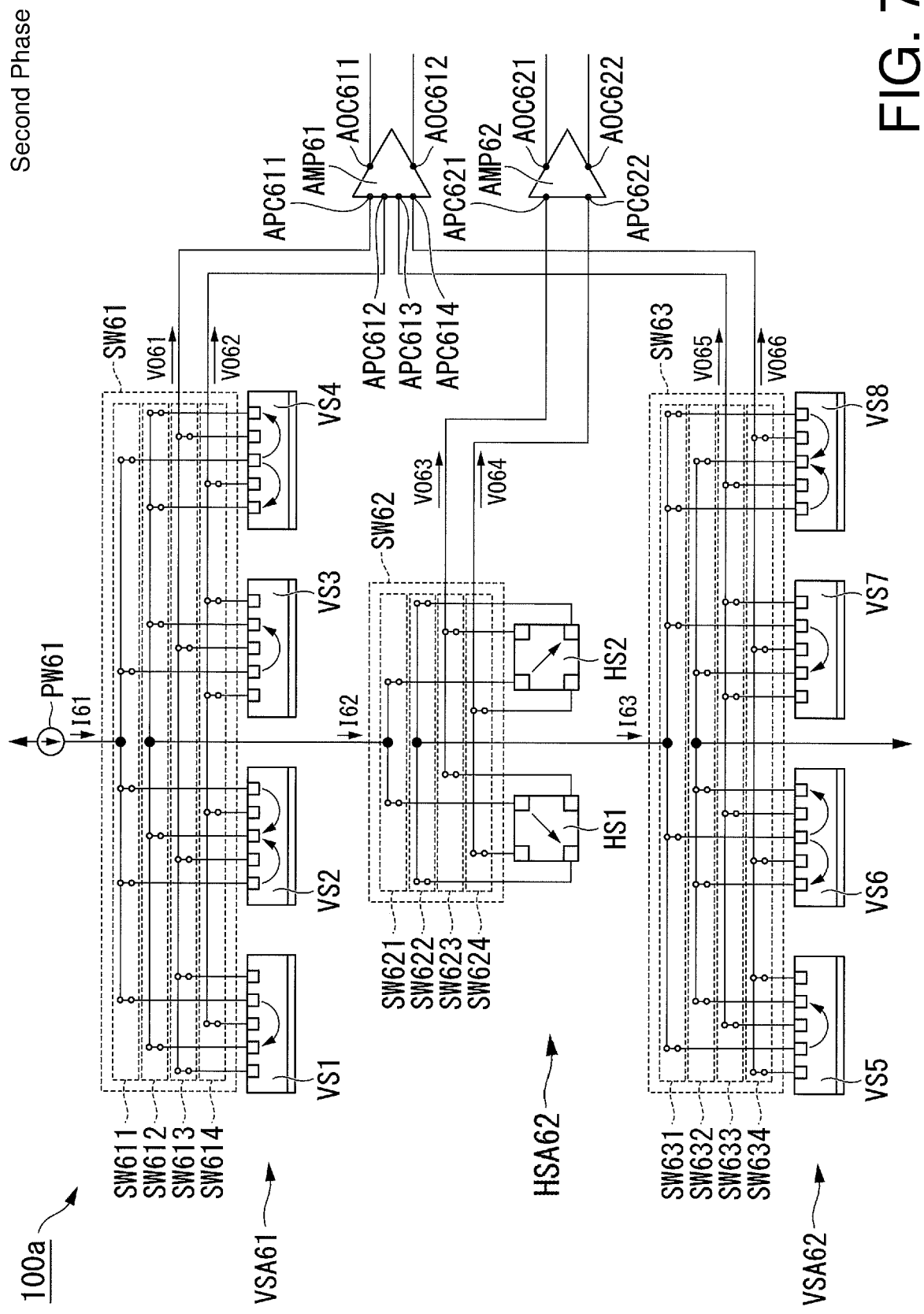
FIG. 7 is a circuit diagram of the magnetic sensor circuit according to the second embodiment in a second phase.

FIG. 7 is a circuit diagram of the magnetic sensor circuit 100a according to the second embodiment in a second phase.

Figure 8:
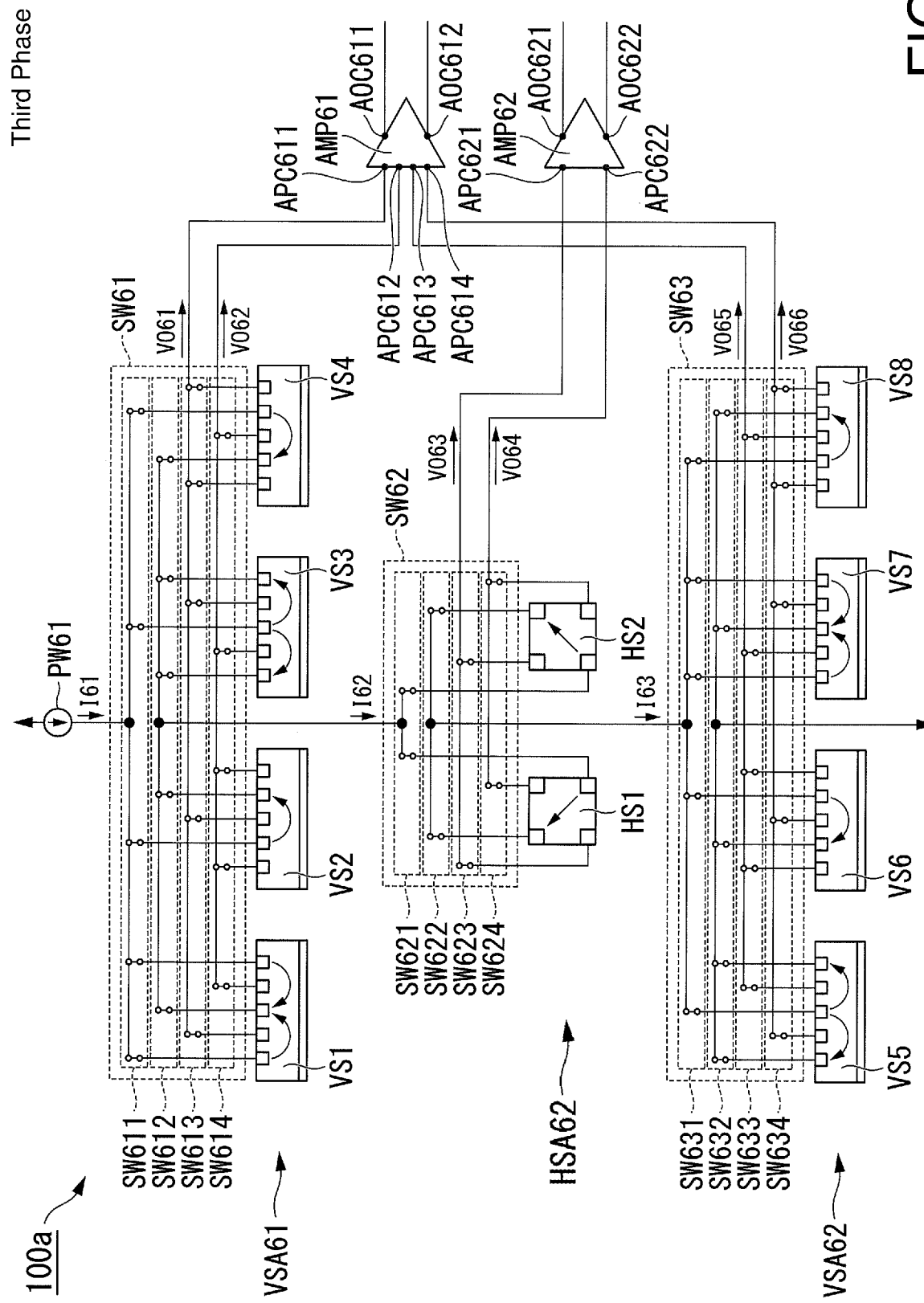
FIG. 8 is a circuit diagram of the magnetic sensor circuit according to the second embodiment in a third phase.

FIG. 8 is a circuit diagram of the magnetic sensor circuit 100a according to the second embodiment in a third phase.

Figure 9:
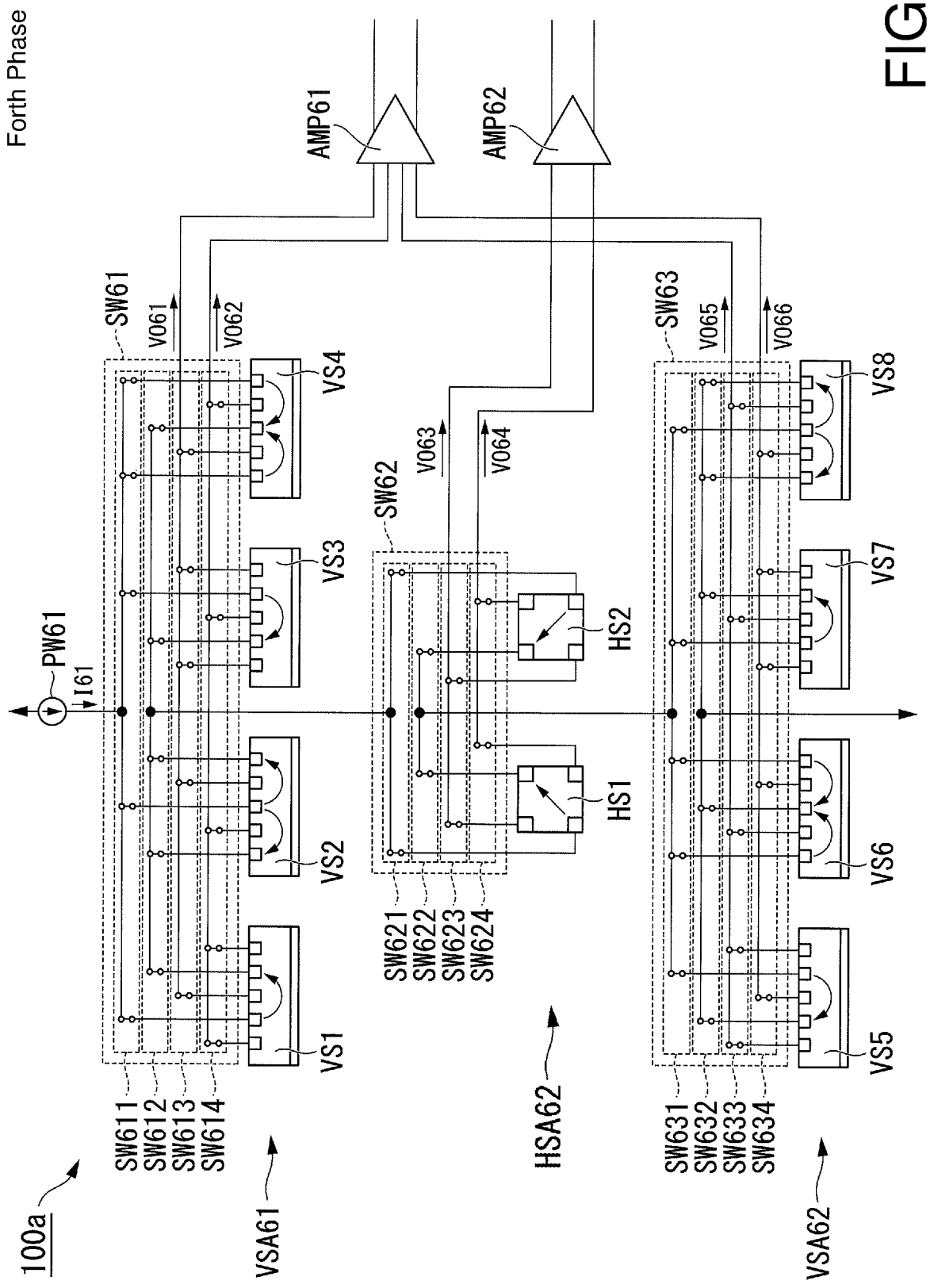
FIG. 9 is a circuit diagram of the magnetic sensor circuit according to the second embodiment in a fourth phase.

FIG. 9 is a circuit diagram of the magnetic sensor circuit 100a according to the second embodiment in a fourth phase.

The magnetic sensor circuit 100a according to the second embodiment includes a driving source PW61, a first magnetic detection portion VSA61, a first magnetic detection portion VSA62, a second magnetic detection portion HSA62, a first switch circuit SW61, a second switch circuit SW62, a third switch circuit SW63, an amplifier circuit AMP61, and an amplifier circuit AMP62.

The driving source PW61 is a constant current source.

The first magnetic detection portion VSA61 includes a vertical Hall element VS1 to a vertical Hall element VS4 which are magneto-electric conversion elements. The vertical Hall element VS1, the vertical Hall element VS2, the vertical Hall element VS3, and the vertical Hall element VS4 are connected in parallel with respect to a power supply. The vertical Hall elements VS1 to VS4 are driven in phases different from one another. The vertical Hall elements VS1 to VS4 are driven in phases different from one another so that a spatial error may be reduced. The reduction of the spatial error is to reduce the error by simultaneously adding and averaging signals using the fact that adjacent Hall elements have substantially the same electrical properties and magnetic properties.

The second magnetic detection portion HSA62 includes a horizontal Hall element HS1 and a horizontal Hall element HS2 which are magneto-electric conversion elements. The horizontal Hall element HS1 and the horizontal Hall element HS2 are driven in phases different from one another. The horizontal Hall element HS1 and the horizontal Hall element HS2 are connected in parallel with respect to the power supply. Further, the horizontal Hall element HS1 and the horizontal Hall element HS2 are arranged so that drive currents flow therethrough in directions that are different from each other by 90°.

The first magnetic detection portion VSA62 includes a vertical Hall element VS5 to a vertical Hall element VS8 which are magneto-electric conversion elements. The vertical Hall element VS5, the vertical Hall element VS6, the vertical Hall element VS7, and the vertical Hall element VS8 are connected in parallel with respect to the power supply. The vertical Hall elements VS5 to VS8 are driven in phases different from one another. Since the vertical Hall elements VS5 to VS8 are driven in phases different from one another, spatial error is reduced.

The first switch circuit SW61 includes a first switch SW611, a first switch SW612, a first switch SW613, and a first switch SW614.

The second switch circuit SW62 includes a second switch SW621, a second switch SW622, a second switch SW623, and a second switch SW624.

The third switch circuit SW63 includes a third switch SW631, a third switch SW632, a third switch SW633, and a third switch SW634.

The first switch circuit SW61, the second switch circuit SW62, and the third switch circuit SW63 are each an example of a switch circuit. The switch circuit selects any one of the plurality of paths of currents that are supplied to the plurality of vertical Hall elements and horizontal Hall elements.

The amplifier circuit AMP61 has an input terminal APC611, an input terminal APC612, an input terminal APC613, an input terminal APC614, an output terminal AOC611, and an output terminal AOC612.

The amplifier circuit AMP62 has an input terminal APC621, an input terminal APC622, an output terminal AOC621, and an output terminal AOC622. Signals that are outputs from the amplifier circuit AMP61 and the amplifier circuit AMP62 may be voltage signals or current signals, as in the amplifier circuit AMP1 and the amplifier circuit AMP2 described above.

The vertical Hall element VS1 to the vertical Hall element VS8, the horizontal Hall element HS1, and the horizontal Hall element HS2 are arranged close to one another.

[Common Matters of Second Embodiment]

The first switch SW611 is connected to the driving source PW61, and a positive power supply terminal of each of the vertical Hall element VS1 to the vertical Hall element VS4. The first switch SW611 selects the supply destination of a current I61, which is supplied from the driving source PW61, among terminals included in each of the vertical Hall element VS1 to the vertical Hall element VS4.

The first switch SW612 is connected to a negative power supply terminal of each of the vertical Hall element VS1 to the vertical Hall element VS4 described above, and the second switch SW621. The first switch SW612 selects the supply source of a current that is supplied from each of the vertical Hall element VS1 to the vertical Hall element VS4 described above, among the terminals included in each of the vertical Hall element VS1 to the vertical Hall element VS4. The first switch SW612 supplies the current, with which the vertical Hall element VS1 to the vertical Hall element VS4 have been driven, to the second switch SW621 as a current I62.

The first switch SW613 is connected to one signal output terminal of each of the vertical Hall element VS1 to the vertical Hall element VS4, and the input terminal APC611 of the amplifier circuit AMP61. The first switch SW613 selects the supply source of a signal VO61 that is an output from each of the vertical Hall element VS1 to the vertical Hall element VS4 described above, among the terminals included in each of the vertical Hall element VS1 to the vertical Hall element VS4. The first switch SW613 supplies a signal that is an output from each of the vertical Hall element VS1 to the vertical Hall element VS4, to the input terminal APC611 as the signal VO61.

The first switch SW614 is connected to another signal output terminal of each of the vertical Hall element VS1 to the vertical Hall element VS4, and the input terminal APC612 of the amplifier circuit AMP61. The first switch SW614 selects the supply source of a signal that is an output from each of the vertical Hall element VS1 to the vertical Hall element VS4, among the terminals included in each of the vertical Hall element VS1 to the vertical Hall element VS4. The first switch SW614 supplies the signal that is an output from each of the vertical Hall element VS1 to the vertical Hall element VS4, to the input terminal APC612 as a signal VO62.

The second switch SW621 is connected to the first switch SW612, and a positive power supply terminal of each of the horizontal Hall element HS1 and the horizontal Hall element HS2. The second switch SW621 selects the supply destination of the current I62, which is supplied from the first switch SW612, among terminals included in each of the horizontal Hall element HS1 and the horizontal Hall element HS2.

The second switch SW622 is connected to a negative power supply terminal of each of the horizontal Hall element HS1 and the horizontal Hall element HS2, and the third switch SW631. The second switch SW622 selects the supply source of a current that is supplied from the negative power supply terminal of each of the horizontal Hall element HS1 and the horizontal Hall element HS2, among the terminals included in each of the horizontal Hall element HS1 and the horizontal Hall element HS2. The second switch SW622 supplies the current I62 with which the horizontal Hall element HS1 and the horizontal Hall element HS2 have been driven to the third switch SW631 as a current I63.

The second switch SW623 is connected to one signal output terminal of each of the horizontal Hall element HS1 and the horizontal Hall element HS2, and the input terminal APC621 of the amplifier circuit AMP62. The second switch SW623 selects the supply source of a signal VO63 that is an output from each of the horizontal Hall element HS1 and the horizontal Hall element HS2, among the terminals included in each of the horizontal Hall element HS1 and the horizontal Hall element HS2. The second switch SW623 supplies a signal that is an output from each of the horizontal Hall element HS1 and the horizontal Hall element HS2 to the input terminal APC621 as the signal VO63.

The second switch SW624 is connected to another signal output terminal included in each of the horizontal Hall element HS1 and the horizontal Hall element HS2, and the input terminal APC622 of the amplifier circuit AMP62. The second switch SW624 selects the supply source of a signal VO64 that is an output from each of the horizontal Hall element HS1 and the horizontal Hall element HS2, among the terminals included in each of the horizontal Hall element HS1 and the horizontal Hall element HS2. The second switch SW624 supplies a signal that is an output from each of the horizontal Hall element HS1 and the horizontal Hall element HS2 to the input terminal APC622 as the signal VO64.

The third switch SW631 is connected to the second switch SW622, and a positive power supply terminal of each of the vertical Hall element VS5 to the vertical Hall element VS8. The third switch SW631 selects the supply destination of the current I63, which is supplied from the second switch SW622, among terminals included in each of the vertical Hall element VS5 to the vertical Hall element VS8.

The third switch SW632 supplies a current that is supplied from a negative power supply terminal of each of the vertical Hall element VS5 to the vertical Hall element VS8, to a negative power supply terminal of the magnetic sensor circuit 100a as a current I64. The current amounts of the current I61 to the current I64, which are described above, are the same.

The third switch SW632 selects the supply source of the current that is supplied from each of the vertical Hall element VS5 to the vertical Hall element VS8 described above, among the terminals included in each of the vertical Hall element VS5 to the vertical Hall element VS8. The third switch SW632 supplies the current with which the vertical Hall element VS5 to the vertical Hall element VS8 have been driven to the negative power supply terminal of the magnetic sensor circuit 100a as the current I64.

The third switch SW633 is connected to one signal output terminal of each of the vertical Hall element VS5 to the vertical Hall element VS8, and the input terminal APC613 of the amplifier circuit AMP61. The third switch SW633 selects the supply source of a signal that is an output from each of the vertical Hall element VS5 to the vertical Hall element VS8 described above, among the terminals included in each of the vertical Hall element VS5 to the vertical Hall element VS8. The third switch SW633 supplies the signal that is an output from each of the vertical Hall element VS5 to the vertical Hall element VS8, to the input terminal APC613 as a signal VO65.

The third switch SW634 is connected to another signal output terminal of each of the vertical Hall element VS5 to the vertical Hall element VS8, and the input terminal APC614 of the amplifier circuit AMP61. The third switch SW634 selects the supply source of a signal that is an output from each of the vertical Hall element VS5 to the vertical Hall element VS8 described above, among the terminals included in each of the vertical Hall element VS5 to the vertical Hall element VS8. The third switch SW634 supplies the signal that is an output from each of the vertical Hall element VS5 to the vertical Hall element VS8, to the input terminal APC614 as a signal VO66.

The amplifier circuit AMP61 amplifies the signal VO61, the signal VO62, the signal VO65, and the signal VO66, which are supplied to the input terminal APC611, the input terminal APC612, the input terminal APC613, and the input terminal APC614, respectively. The amplifier circuit AMP61 outputs the amplified signals from the output terminal AOC611 and the output terminal AOC612.

The amplifier circuit AMP62 amplifies the signal VO63 and the signal VO64, which are supplied to the input terminal APC621 and the input terminal APC622, respectively. The amplifier circuit AMP62 outputs the amplified signals from the output terminal AOC621 and the output terminal AOC622.

As illustrated in FIG. 6 to FIG. 9, the magnetic sensor circuit 100a is driven in four phases with time as in the first embodiment.

Summary of Second Embodiment

When spinning is caused in the vertical Hall element VS1 to the vertical Hall element VS4 among the four phases of the first phase to the fourth phase, the vertical Hall element VS1 to the vertical Hall element VS4 have resistance values different from one another. In the second embodiment, however, the four vertical Hall elements which are included in the first magnetic detection portion VSA61 and are connected in parallel with respect to the power supply are driven in phases different from one another. With this configuration, the magnetic sensor circuit 100a can form four spinning phases in the first magnetic detection portion VSA61. As a result, the first magnetic detection portion VSA61 has the same resistance value in every spinning phase, and the signal VO61 and the signal VO62, which are output from the vertical Hall element VS1 to the vertical Hall element VS4, thus have stable output characteristics. The same is true for the first magnetic detection portion VSA62.

In a similar manner, the horizontal Hall element HS1 and the horizontal Hall element HS2, which are included in the second magnetic detection portion HSA62, have the same resistance value in every spinning phase, and the signal VO63 and the signal VO64, which are output from the horizontal Hall element HS1 and the horizontal Hall element HS2, thus have stable output characteristics. Further, the drive currents flow through the horizontal Hall element HS1 and the horizontal Hall element HS2 in the directions that are different from each other by 90°. With this configuration, the magnetic sensor circuit 100a can reduce an offset due to the geometric imbalance in each of the phases of the first phase to the fourth phase by adding the signals from the horizontal Hall element HS1 and the horizontal Hall element HS2. As a result, the magnetic sensor circuit 100a can obtain the more accurate signal VO63 and the more accurate signal VO64.

Further, in the second embodiment, the first magnetic detection portion VSA61, the second magnetic detection portion HSA62, and the first magnetic detection portion VSA62 are connected in series with respect to the driving source PW61. This configuration achieves a higher power efficiency of the signals from the Hall elements that are included in the first magnetic detection portion VSA61, the second magnetic detection portion HSA62, and the first magnetic detection portion VSA62.

Third Embodiment

Next, a magnetic sensor circuit according to a third embodiment of the present invention is described with reference to FIG. 10. The configuration and operation of the third embodiment that are the same as those of the first embodiment and the second embodiment are denoted by the same reference symbols, and descriptions thereof are omitted.

Figure 10:
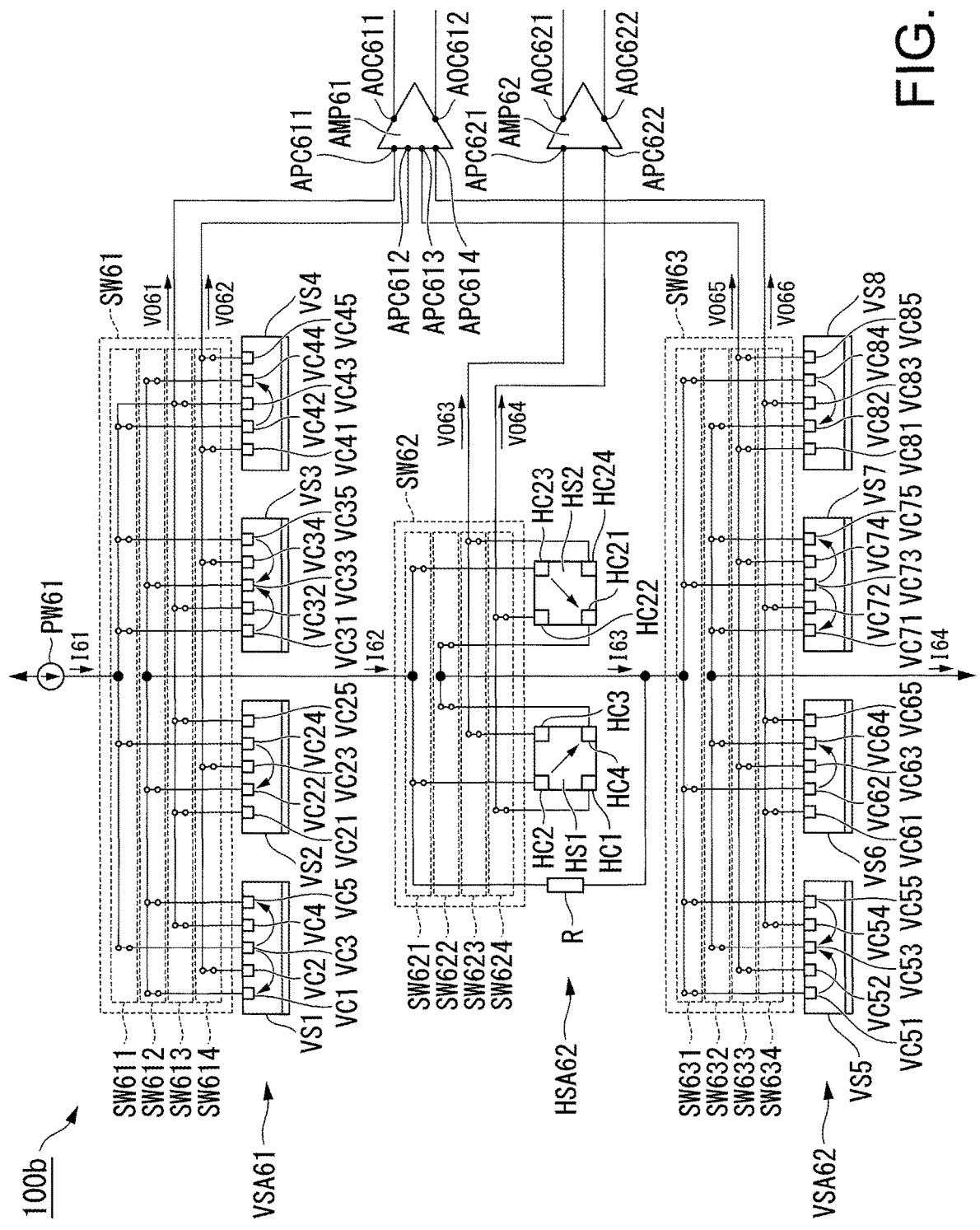
FIG. 10 is a circuit diagram of a magnetic sensor circuit according to a third embodiment of the present invention in a certain phase.

FIG. 10 is a circuit diagram of a magnetic sensor circuit 100b according to the third embodiment in a certain phase.

The magnetic sensor circuit 100b further includes a current correction load portion R. The current correction load portion R is connected in parallel to the first sensor or the second sensor, and corrects the drive current of signals. FIG. 10 is an illustration of an example of the current correction load portion R connected in parallel to the second sensor. The current correction load portion R may specifically be a resistance element or a circuit element configured to cause a constant current to flow. The current correction load portion R adjusts the amount of current that is supplied to the sensor connected in parallel thereto. With this configuration, the sensitivity of the sensor connected in parallel to the current correction load portion R can be adjusted.

The current correction load portion R is configured to adjust the drive current of the second magnetic detection portion HSA62 in the description above, but the present invention is not limited thereto. The current correction load portion R may be connected in parallel to the first magnetic detection portion VSA61 or the first magnetic detection portion VSA62.

The driving sources for the Hall elements of the first embodiment to the third embodiment described above are the constant current sources, but the present invention is not limited thereto. The driving source may be a voltage source. When the driving source is the constant current source, a constant current can be supplied as the drive current for driving the first magnetic detection portion and the second magnetic detection portion, and hence the accuracy of the signals that are output from the Hall elements can be enhanced.

The magnetic sensor circuits of the first embodiment to the third embodiment described above are configured to detect magnetic fields with respect to the two axes of the horizontal and vertical axes, but the present invention is not limited thereto. The present invention can be applied to a magnetic sensor circuit being a three-axis magnetic sensor circuit in a similar manner. The three-axis magnetic sensor circuit is a magnetic sensor circuit having a configuration in which two vertical Hall elements and a horizontal Hall element are connected in series with respect to a driving source. Specifically, the three-axis magnetic sensor circuit detects a magnetic field (X-Y axis) that is horizontal to the plane of a semiconductor substrate with use of the two vertical Hall elements being arranged in directions that are different from each other by 90°. Further, the three-axis magnetic sensor circuit detects a vertical magnetic field (Z axis) that is orthogonal to the plane of the semiconductor substrate with use of the horizontal Hall element. This three-axis magnetic sensor can provide the same effects as those of the two-axis magnetic sensor circuits described above.

Certain embodiments and variations of the present invention have been described. However, those embodiments and variations are presented as examples and are not intended to limit the scope of the invention. Those embodiments and variations thereof may be implemented in other various modes, and various kinds of omissions, replacements, and modifications can be made without departing from the gist of the invention. Those embodiments and variations thereof are included in the scopes of the invention described in the appended claims and their equivalents in the same way as those are included in the scope and gist of the invention. Further, the above-mentioned embodiments and variations thereof can be combined as appropriate.

What is claimed is:

1. A magnetic sensor circuit, comprising:
a first magnetic detection portion; and
a second magnetic detection portion,
the first magnetic detection portion comprising:
at least two output terminals for outputting first signals that are in phases opposite to each other and each correspond to a strength of a magnetic field in a first direction;
a positive terminal to which a drive current of the first signals is supplied; and
a negative terminal from which the drive current flows out,
the second magnetic detection portion comprising:
at least two output terminals for outputting second signals that are in phases opposite to each other and each correspond to a strength of a magnetic field in a second direction that is a direction different from the first direction; and
a positive terminal to which the drive current of the second signals is supplied,
the positive terminal of the first magnetic detection portion, the negative terminal of the first magnetic detection portion, and the positive terminal of the second magnetic detection portion being connected in series with respect to a path of the drive current of the first signals supplied from a power supply.

2. A magnetic sensor circuit according to claim 1,
wherein the first magnetic detection portion includes a first sensor configured to detect the magnetic field in the first direction,
wherein the second magnetic detection portion includes a second sensor configured to detect the magnetic field in the second direction, and
further comprising a current correction load portion connected in parallel to one of the first sensor and the second sensor, and configured to correct the drive current of the signals.

3. A magnetic sensor circuit according to claim 2,
wherein the first sensor includes a plurality of first Hall elements,
wherein the second sensor includes a plurality of second Hall elements, and
further comprising a switch circuit configured to select any one of a plurality of paths of currents supplied to the plurality of the first Hall elements and the plurality of the second Hall elements.

4. A magnetic sensor circuit according to claim 3,
wherein each of the plurality of second Hall elements includes a Hall element configured to detect a signal corresponding to a strength of a magnetic field applied in a horizontal direction, and
wherein at least four second Hall elements of the plurality of second Hall elements are connected in parallel to one another.

5. A magnetic sensor circuit according to claim 1, wherein the power supply includes a constant current source.

6. A magnetic sensor circuit according to claim 2, wherein the power supply includes a constant current source.

7. A magnetic sensor circuit according to claim 3, wherein the power supply includes a constant current source.

8. A magnetic sensor circuit according to claim 4, wherein the power supply includes a constant current source.

* * * * *